United States Patent

Miura

[11] Patent Number: 5,923,990
[45] Date of Patent: Jul. 13, 1999

[54] PROCESS FOR POSITIONING A MASK RELATIVE TO A WORKPIECE

[75] Inventor: Shinetsu Miura, Kawasaki, Japan

[73] Assignee: Ushiodenki Kabushiki Kaisha, Kawasaki, Japan

[21] Appl. No.: 08/904,768

[22] Filed: Aug. 1, 1997

[30] Foreign Application Priority Data

Aug. 1, 1996 [JP] Japan .................................. 8-203578

[51] Int. Cl.⁶ .............................................. H01L 21/76
[52] U.S. Cl. .......................................... 438/401; 438/462
[58] Field of Search .................................. 438/401, 462, 438/14

[56] References Cited

U.S. PATENT DOCUMENTS 4,573,791  3/1986  Phillips ...................................... 355/77
5,841,520  8/1996  Taniguchi .................................. 355/53

*Primary Examiner*—Charles Bowers
*Assistant Examiner*—Craig Thompson

*Attorney, Agent, or Firm*—Sixbey, Friedman, Leedom & Ferguson; David S. Safran

[57] ABSTRACT

To increase operating efficiency and prevent operating errors, such as adjustment errors and the like, by automatic computation of the distance between the workpiece alignment marks, according to the invention, workpiece alignment marks located at two locations on a workpiece are subjected to image recording by alignment units, their positions are stored as first positions, then by rotation of the workpiece by a preset very small angle, the workpiece alignment marks located at two locations on the workpiece are determined again, and their positions are stored as second positions. Based on the data of the first and second positions, the distance between the workpiece alignment marks is determined. Then, based on the distance data, the angular offset of the workpiece is determined. After correction of this angular offset, the mask and/or the workpiece is/are moved such that the images of the mask alignment marks and the workpiece alignment marks come to rest on top of one another.

1 Claim, 7 Drawing Sheets

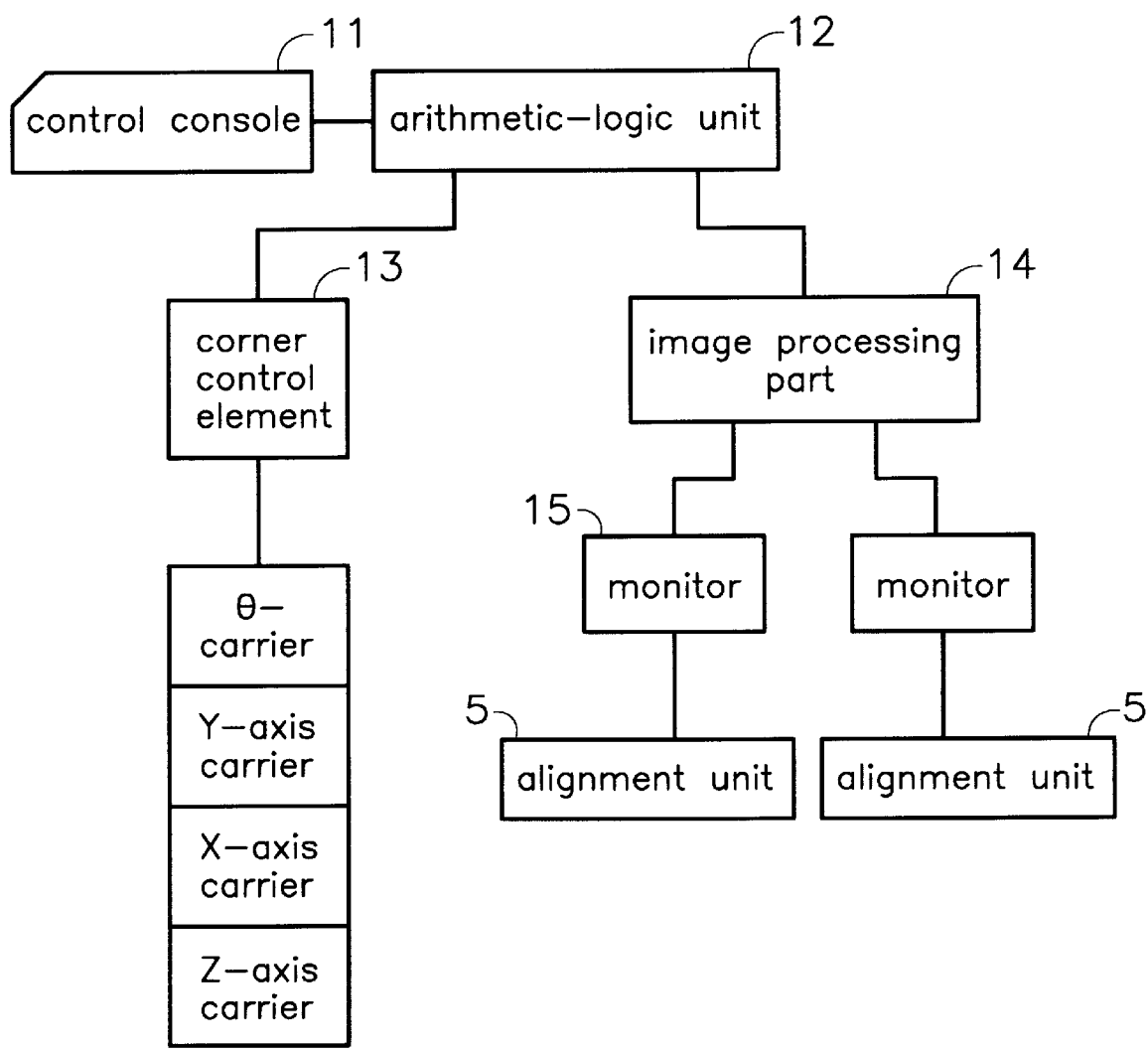

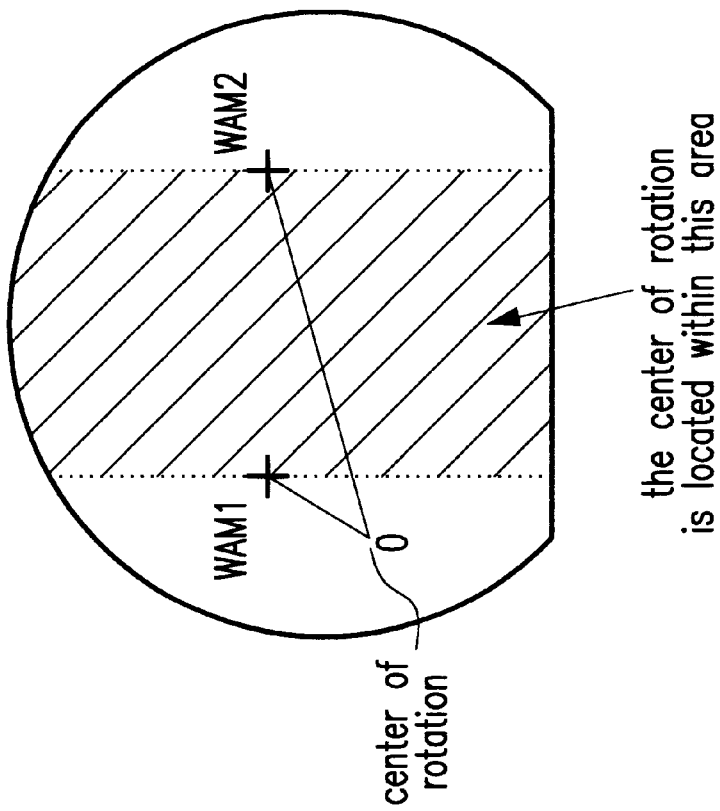
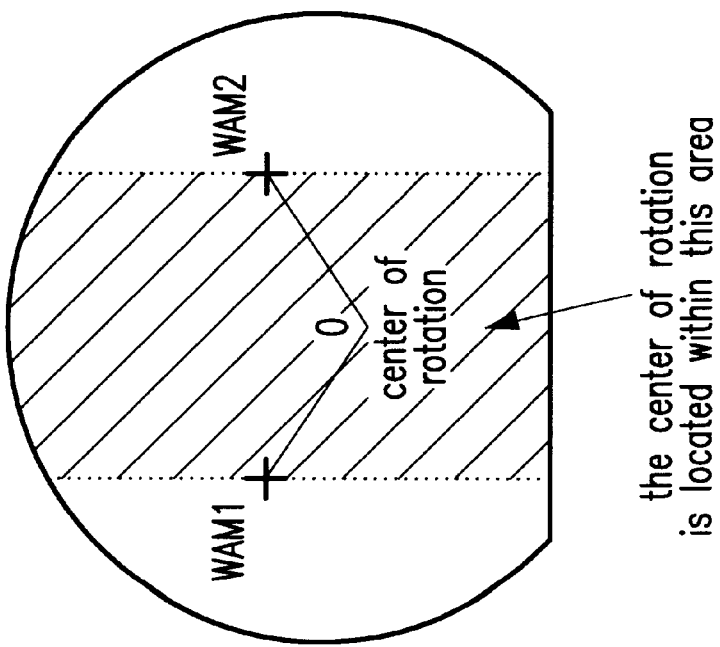

visual field of an alignment unit visual field of an alignment unit visual field of an alignment unit visual field of an alignment unit visual field of an alignment unit

PROCESS FOR POSITIONING A MASK RELATIVE TO A WORKPIECE

BACKGROUND OF THE INVENTION

1. Field of the Invention

The invention relates to a process for automatic positioning of a mask relative to a workpiece and a device for executing the process in an exposure device which is used for producing a semiconductor device, a printed board, and a LCD (liquid crystal display) and for similar purposes. The invention relates especially to a process for positioning a mask relative to a workpiece in which the distance between the two alignment marks can be automatically computed; the marks can be used for positioning a mask relative to a workpiece and they are recorded on the workpiece. The invention furthermore relates to a device for executing this process.

2. Description of Related Art

Production of electrical and electronic components and parts of various types in which processing of structures in the micron range is necessary encompasses an exposure process. These electronic parts are semiconductor components, liquid crystal displays, printer heads of the inkjet type, multichip modules in which a plurality of different electronic components are produced on a substrate and thus a module is formed, and the like. In this exposure process, a mask is used in which metal, such as chromium or the like, is vacuum-evaporated and etched on a transparent substrate, such as glass or the like, and a pattern formed. Through this mask, ultraviolet rays are emitted onto the workpiece and the mask pattern is transferred to the photoresist which has been applied to the workpiece.

Exposure systems are divided into the projection printing type, the contact printing type, and the proximity printing system type. In the projection printing type, a mask image is imaged onto the workpiece by a projection lens. In the contact printing system, parallel light is emitted in a state in which the mask and the workpiece are arranged directly abutting one another. In the proximity printing system, parallel light is emitted in a state in which a small intermediate space is formed between the mask and the workpiece.

In this exposure process, it is important in the case of transfer of the mask pattern onto the workpiece, that a pattern to be transferred subsequently is exactly positioned relative to a pattern formed beforehand. The above described positioning is ordinarily done such that the alignment marks of the mask and the workpiece come to rest on top of one another.

FIG. 1 schematically shows the arrangement of a projection exposure device in which the invention can be used. First of all conventional positioning of the mask relative to the workpiece is described below using FIG. 1:

In the figure, an exposure light irradiation device (or a nonexposure light irradiation device) 1, which has a lamp 1a which emits exposure light, for example a high-pressure mercury lamp or the like, a focussing mirror 1b, a shutter 1c, an optical filter 1d which is used when nonexposure light is emitted, and a condenser lens 1e, is shown.

Furthermore, a mask carrier 2 is shown which is driven by means of a drive device (not shown) in the X-Y-Z-Θ directions (X-axis, Y-axis: orthogonal axes on a plane parallel to one workpiece carrier surface, Z-axis: an axis perpendicular to the workpiece carrier surface, Θ-axis: an axis of rotation around the Z-axis).

Reference letter M designates a mask on which a mask pattern and mask alignment marks MAM1, MAM2 are recorded for purposes of positioning. Reference number 3 indicates a projection lens and reference letter W a workpiece. Workpiece alignment marks WAM1, WAM2 are recorded on workpiece W for purposes of positioning by a workpiece carrier which is driven by a drive (not shown) in the X-Y-Z-Θ directions, Reference number WA1 indicates a workpiece alignment mark partial illumination system. The nonexposure light emitted from a light source (not shown) is incident via optical fibers 6a, furthermore via lens 6b and mirror 6c, on a half mirror 5e of alignment unit 5, and via a lens 5b and a half mirror 5c, irradiates workpiece alignment mark WAM on workpiece W.

An alignment unit 5 consists of a lens 5a, an objective lens 5b, half mirrors 5c and 5e, and an image sensor 5d which has a CCD camera. The mask alignment mark MAM projected onto the workpiece W and the workpiece alignment mark WAM irradiated by workpiece alignment mark partial illumination system WA1 are recorded via half mirror 5c, objective lens 5b, half mirror 5e and lens 5a by means of image sensor 5d.

On each of mask M and workpiece W are several mask alignment marks MAM1, MAM2 and several workpiece alignment marks WAM1, WAM2 (each at two locations in this case), and alignment unit 5 and workpiece alignment mark partial illumination system WA1 are assigned accordingly to the respective alignment mark.

In the figure, mask M is positioned relative to the workpiece W in the following manner:

(1) Workpiece W on which workpiece alignment marks WAM1, WAM2 are recorded is subjected to prealignment and placed on workpiece carrier 4.

(2) Nonexposure light (or exposure light) is emitted from exposure light irradiation device (or a nonexposure light irradiation device) 1 onto mask alignment marks MAM1, MAM2 of mask M.

(3) The images of the above described mask alignment marks, which are imaged on workpiece W, are recorded by image sensors 5d of alignment units 5 and their positions are stored by an image processing device (not shown). Here, it is assumed that the line to the X-axis or Y-axis formed between the above described mask alignment marks MAM1 and MAM2 is set parallel and represents the direction of motion of the workpiece carrier and/or mask carrier.

(4) Nonexposure light (or exposure light) is emitted from workpiece alignment mark partial illumination systems WA1 onto workpiece alignment marks WAM1, WAM2 of workpiece W and workpiece alignment marks WAM1, WAM2 on workpiece W are determined by means of alignment units 5.

(5) Based on the positions of the images of the above described mask alignment marks and the positions of the images of the workpiece alignment marks which were determined by alignment units 5, a measure of the position deviation of mask M from workpiece W is computed. Based on this value, mask carrier 2 and/or workpiece carrier 4 is/are moved and positioning of the mask M relative to the workpiece W is performed.

Computation of the above described measure of the position deviation and the positioning of the mask to the workpiece accomplished thereby are performed in the following manner:

(1) How many degrees workpiece alignment marks WAM1, WAM2 are angularly offset with reference to mask alignment marks MAM1, MAM2 is computed. This means that how many degrees the segment formed between workpiece alignment marks WAM1 and WAM2 is angularly offset with reference to the segment formed between mask alignment marks MAM1 and MAM2 is computed. (This angular offset is hereinafter called "ΔΘ").

FIG. 8 schematically represents the process for computing the above described measuring of the position deviation. In the figure, the images of the mask alignment marks MAM1, MAM2 and the images of workpiece alignment marks WAM1, WAM2, which were recorded by means of alignment units 5, are shown. In the figure, A and B each identify the images recorded by alignment units 5 located at two positions.

In FIG. 8, the following formula (1) applies when the above described angular offset is are represented as ΔΘ, the respective position coordinates of the workpiece alignment marks WAM1, WAM2 are represented as (x1, y1), (x2, y2) and the distance between them is represented by L:

$$\Delta\Theta = \sin^{-1}((y2-y1)) \quad (1)$$

The angular offset ΔΘ can be determined using the above described equation (1) when the position coordinates of the workpiece alignment marks WAM1, WAM2 are found, since the distance L is stipulated.

(2) If the angular offset Ae has been determined in this way, workpiece carrier 4 (or mask carrier 2) is rotated according to angular offset ΔΘ.

After rotation, again, mask alignment marks MAM1, MAM2 and workpiece alignment marks WAM1, WAM2 are determined by means of alignment units 5. Workpiece carrier 4 and/or mask to carrier 2 is/are moved in the X-axis direction and/or Y-axis direction such that two alignment marks MAM1, WAM1 and MAM2, WAM2 come to rest on top of one another.

After positioning of mask M to workpiece W in the above described manner, exposure light is emitted from exposure light irradiation device (or nonexposure light irradiation device) 1, the mask pattern is projected on workpiece W, and exposure is accomplished.

The distance L between workpiece alignment marks WAM1 and WAM2 on the workpiece does change according to the size of workpiece W. But, it is a value that is specific to the manufacturer. Distance L was therefore conventionally integrated in the computer run in the process of producing the exposure device.

Furthermore, under certain circumstances there was additionally a means for distinguishing the size of workpiece W, different values of L were stored in the device and a value of L which corresponds to the size of workpiece W was called up.

However, workpiece alignment marks WAM are often located in the strips between the circuit patterns and in the peripheral area of the workpiece in which a circuit pattern cannot be formed. Recently, therefore, there have been workpieces with different distances L between workpiece alignment marks WAM1 and WAM2 as a result of the different types (shape, size) of circuit patterns produced in the workpiece, even if they originate from the same manufacturer and have the same size. It has, therefore, become more and more difficult to integrate the value of L beforehand in the exposure device as a constant.

To handle products with different distances L between workpiece alignment marks WAM1 and WAM2, therefore, the value of L must be manually set; this causes more working steps. Furthermore, here, there is the danger that adjustment errors are caused when the value of the above described distance L is set.

SUMMARY OF THE INVENTION

The invention was devised on the basis of the above described facts. Therefore, a primary object of the invention is to make the input of the distance between the workpiece alignment marks superfluous, to increase operating efficiency and to prevent operating errors, such as adjustment errors and the like, by automatic computation of the distance between the workpiece alignment marks.

This object is achieved according to the invention as follows:

(1) When a mask is positioned relative to a workpiece, by irradiation of the mask alignment marks with exposure light or nonexposure light from a light irradiation part, positioning is performed by determining the images of the mask alignment marks which are imaged on a workpiece, and determining of workpiece alignment marks of the workpiece, and by moving and offsetting the mask and/or the workpiece in two orthogonally intersecting directions parallel to the workpiece surface and rotating the mask and/or workpiece around an axis of rotation which is perpendicular to a plane which contains these two directions, so that the two alignment marks come to rest on top of one another, the workpiece alignment marks located at two locations on the workpiece are each determined and their positions are stored as the first positions. Afterwards the workpiece is rotated by a stipulated first angle. After this rotation, the above described alignment marks located at two locations on the workpiece are each determined again. Their positions are stored as second positions. Based on the data of the above described first and second positions, and as a result of the above described first angle, the distance between the workpiece alignment marks located on the workpiece is determined at two locations. Then, based on the data of the distance between the above described workpiece alignment marks, a second angle is determined which is formed by a line which passes through the workpiece alignment marks at the two locations on the above described workpiece, and by a line which passes through the mask alignment marks at the two locations. According to the above described second angle, the mask or the workpiece is rotated around the above described axis of rotation. After this rotation, the images of the mask alignment marks imaged on the workpiece and the workpiece alignment marks are determined, and the mask and/or workpiece moved such that the two alignment marks come to rest on top of one another.

(2) If the distance between the workpiece alignment marks on the workpiece determined above in (1) is outside a stipulated range, further processes are stopped and an error messages sent.

In accordance with the invention, by determining the distance between workpiece alignment marks in the manner described above in (1) and by positioning of the mask relative to the workpiece, in spite of the different distances between the workpiece alignment marks, positioning of the mask relative to the workpiece can be achieved without inputting of the distance between the workpiece alignment marks, if the two workpiece alignment marks are located within the visual fields of the alignment units. In this way, operating errors, such as adjustment errors of the value of distance L and the like, can be prevented.

Furthermore, with respect to workpieces with different distances between the workpiece alignment marks, only by adjusting the positions of the alignment units such that the workpiece alignment marks extend into the visual fields of the alignment units can flexible measures for assistance be taken.

In addition, by the measure by which the distance between the workpiece alignment marks is measured each time, it can be immediately checked whether major changes of the distance between the workpiece alignment marks have occurred or not. This occurs when, as a result of the different distances between the workpiece alignment marks, problems arise with which positioning of the mask relative to the workpiece cannot be performed.

With the invention, products can be protected from problems by the measure described above in (2) by which further processes are stopped and error messages are sent when the distance between the workpiece alignment marks are outside of a stipulated area.

These and further objects, features and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 2 a block diagram of an arrangement of a system for controlling the projection exposure device shown in FIG. 1;

FIGS. 3($a$) and 3($b$) each show a schematic of the relation between the workpiece alignment marks and the center of rotation of the workpiece;

FIG. 4($c$) depicts the relationship between the computations of FIGS. 4($a$) and 4($b$).

DETAILED DESCRIPTION OF THE PREFERRED EMBODIMENT

Figure 1:
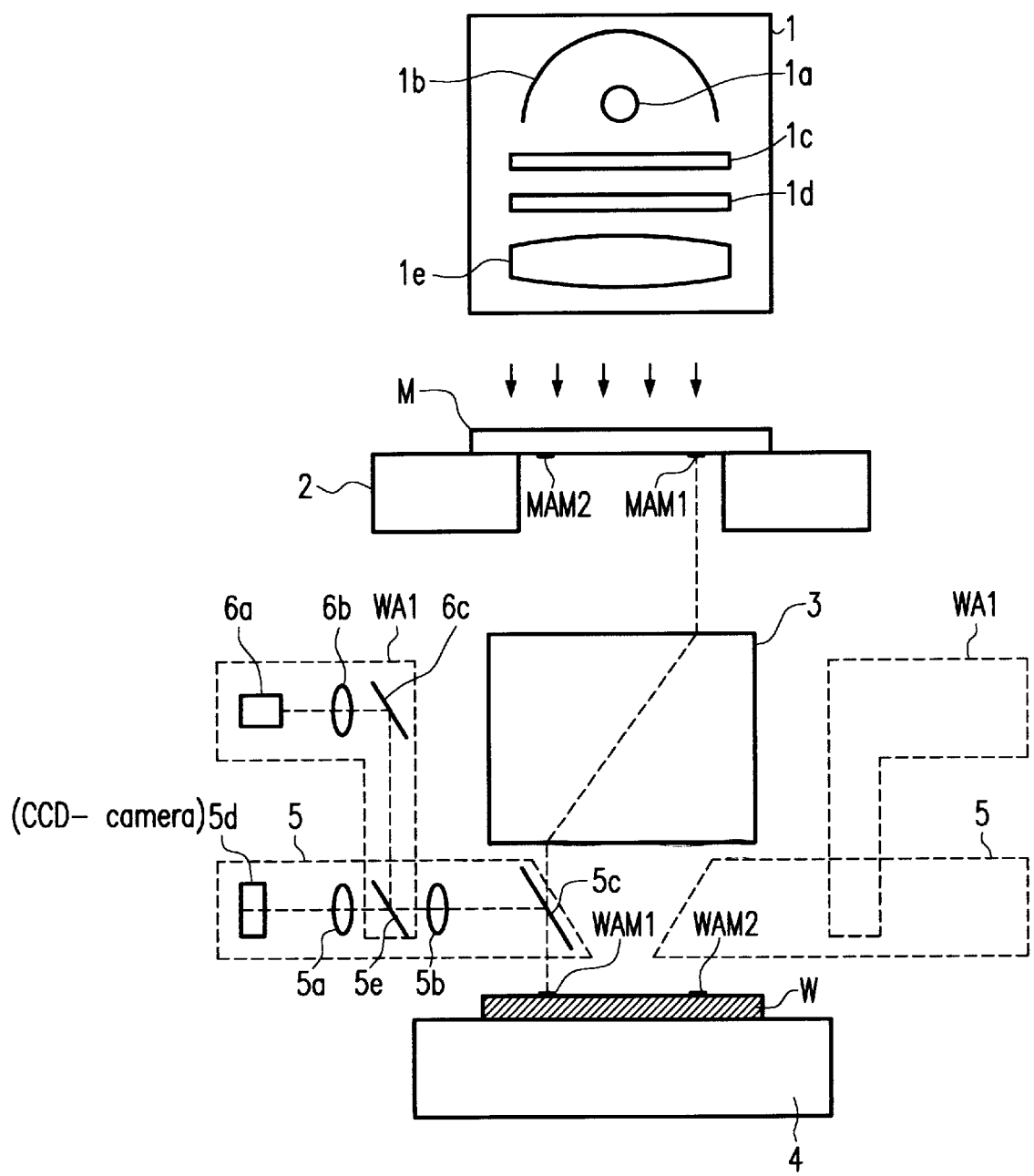
FIG. 1 shows a schematic of a projection exposure device in which the invention can be used.

In the following, one embodiment of the invention is described using the exposure device of the projection printing type shown in FIG. 1. However, the invention can be used not only for the above described exposure device of the projection printing type, but also for the above described exposure devices of the contact printing type and proximity printing type.

FIG. 2 is a block diagram of the arrangement of a system for controlling the projection exposure device shown above in FIG. 1. In the figure, are shown a control console 11, an arithmetic-logic unit 12 for controlling the projection exposure device shown in FIG. 1, and a carrier control element 13 which drives a Θ carrier, a Y-axis carrier, a X-axis carrier and a Z-axis carrier and which moves mask carrier 2 and the workpiece carrier 4 (shown in FIG. 1) in the X-Y-Z-Θ directions. Also depicted is an image processing part 14 which recognizes mask alignment marks MAM1, MAM2 and workpiece alignment marks WAM1, WAM2 recorded by means of the image sensors 5$d$ of alignment units 5 and determines the position coordinates hereof, as is described below.

Furthermore, arithmetic-logic unit 12 determines the deviations of the positions of above described mask alignment marks MAM1, MAM2 and workpiece alignment marks WAM1, WAM2 which were determined in image processing part 14. Carrier control element 13 moves mask carrier 2 and/or workpiece carrier 4 such that the two agree with one another. Mask alignment marks MAM and workpiece alignment marks WAM recorded by alignment units 5 are displayed on monitor 15.

Here, the center of rotation of workpiece W on workpiece carrier 4 is generally located between workpiece alignment marks WAM1 and WAM2, as is illustrated in FIG. 3($a$). In this embodiment, therefore, mainly the case of FIG. 3($a$) is described. However, it can also be applied to the case shown in FIG. 3($b$) in which the center of rotation of workpiece W is outside of workpiece alignment marks WAM1, WAM2, as is described below.

In the following, the positioning of the mask relative to the workpiece according to the embodiment of the invention is described. Following steps (1) to (4) are identical to the conventional example described above.

(1) Workpiece W on which workpiece alignment marks WAM1, WAM2 are recorded is subjected to prealignment and placed on workpiece carrier 4.

(2) Nonexposure light (or exposure light) is emitted from exposure light irradiation device (or nonexposure light irradiation device) 1 onto mask alignment marks MAM1, MAM2 of mask M.

(3) The images of the above described mask alignment marks which are imaged on workpiece W are recorded by means of image sensors 5$d$ of alignment units 5, and their positions are stored by means of an image processing device which is not shown in the drawings.

(4) Nonexposure light (or exposure light) is emitted from workpiece alignment mark partial illumination systems WA1 onto workpiece alignment marks WAM1, WAM2 of workpiece W, and workpiece alignment marks WAM1, WAM2 are recorded on workpiece W by means of image sensors 5$d$ of alignment units 5. The images recorded by image sensors 5$d$ are sent to image processing part 14 shown in FIG. 2 which determines and stores the position coordinates of workpiece alignment marks WAM1, WAM2 based on the images. FIG. 4($a$) is a schematic of mask alignment marks MAM1, MAM2 and workpiece alignment marks WAM1, WAM2 recorded by alignment units 5. In the figure, reference letters A and B respectively label the images which were recorded by alignment units 5 located at two positions. Here, angular offset ΔΘ is α, the position coordinates of the workpiece alignment mark WAM1 are (x1, y1) and the position coordinates of the workpiece alignment mark WAM2 are (x2, y2).

(5) Carrier control element 13 shown in FIG. 2 drives the Θ carrier of workpiece carrier 4 and rotates it around the center of workpiece carrier 4 only by a very small angle γ which is predetermined in the Θ direction (for example, by roughly 0.1 degree) to the extent that the workpiece alignment marks WAM1, WAM2 do not emerge from the visual fields of two alignment units 5.

(6) Workpiece alignment marks WAM1, WAM2 are again recorded by means of image sensors 5d of alignment units 5 and their position coordinates are determined and stored in image processing part 14. FIG. 4(b) is a schematic of mask alignment marks MAM1, MAM2 and workpiece alignment marks WAM1, WAM2 recorded by alignment units 5 recorded the second time. Here, angular offset ΔΘ is β, the position coordinates of workpiece alignment mark WAM 1 are (x3, y3) and the position coordinates of workpiece alignment mark WAM2 are (x4, y4).

(7) Arithmetic-logic unit 12 in FIG. 3, on the basis of the position coordinates of workpiece alignment marks WAM1, WAM2 which were determined above in steps (4) and (6), determines the position deviation as a result of precision rotation in the Θ direction in (5). Based on this position deviation, distance L between the workpiece alignment marks WAM1 and WAM2 is computed at two locations in the following manner: Here, it is assumed that workpiece W has undergone prealignment and that the positioning of the deviation in the Θ direction was produced such that the workpiece alignment marks WAM1, WAM2 extend into the visual fields of alignment units 5. Conventionally, an arrangement is used in which the distance L between the workpiece alignment marks WAM1 and WAM2 is 50 mm to 150 mm and the visual fields of alignment units 5 are roughly 1.5 mm. The deviation in the Θ direction is computed approximately in the manner described below:

$\tan^{-1}$ (1.5 mm/50 mm)~1.7°−0.03 radian

Figure 4A:
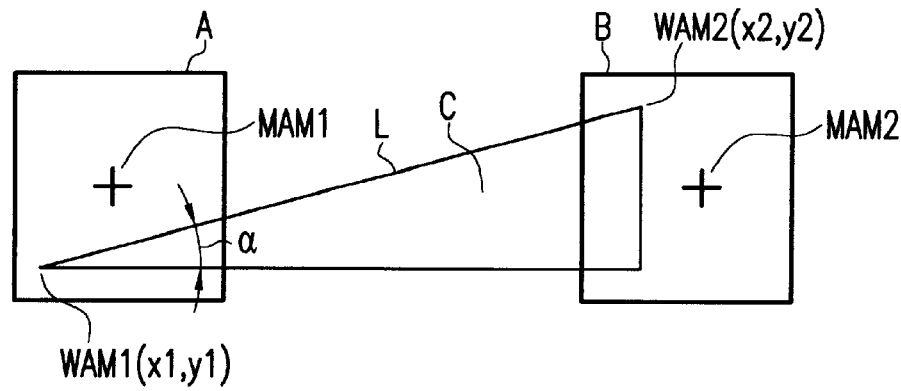
FIGS. 4($a$) and 4($b$) each show a schematic of computation of the amount of position deviation in the case of FIG. 3($a$)
Figure 4B:
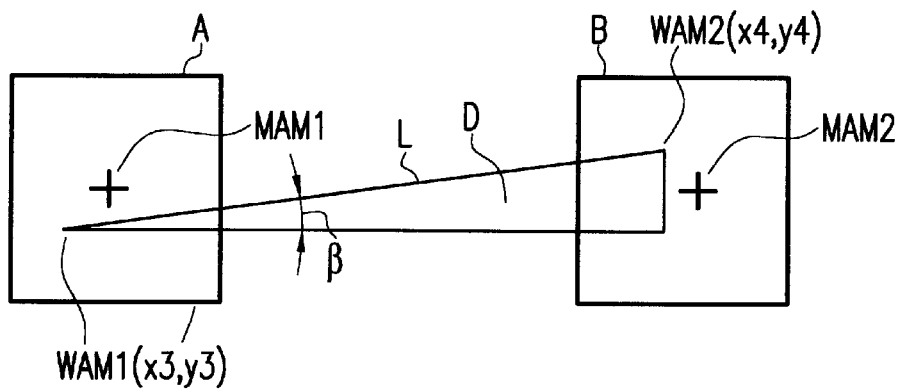

1) According to FIG. 4(a), the following equation (2) applies:

$$\sin \alpha = (y2-y1)/L \quad (2)$$

Furthermore, according to FIG. 4(b) the following equation applies:

$$\sin \beta = (y4-y3)/L \quad (3)$$

Here, the following approximation applies since the deviation in the Θ direction from the above described assumed condition is relatively small:

$$\sin \alpha = \alpha \text{ and } \sin \beta = \beta$$

Figure 4C:
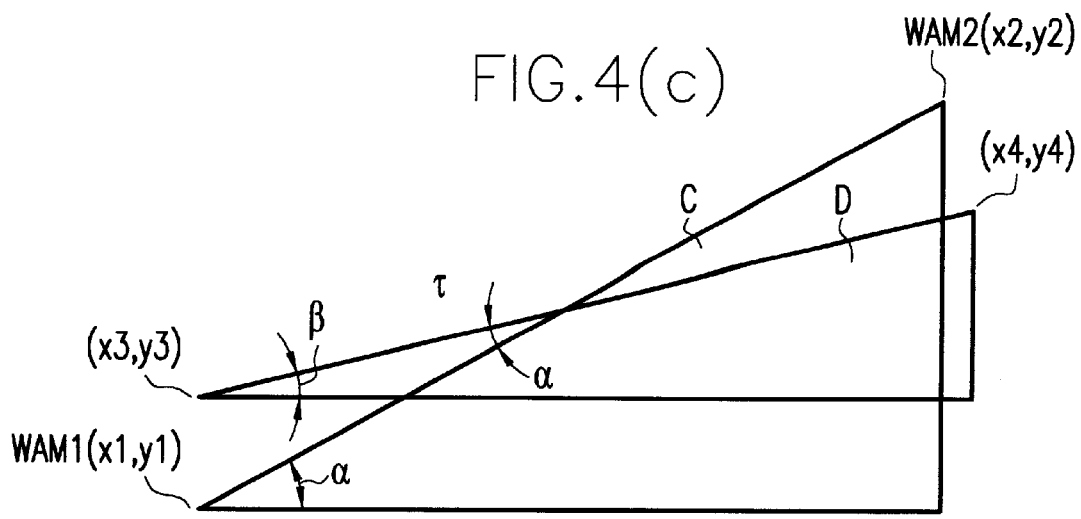

2) FIG. 4(c) shows a schematic in which triangles C and D in FIGS. 4(a) & 4(b) come to rest on top of one another. As is apparent from the drawings, following equation (4) applies:

$$\beta = \gamma = \alpha$$

That is, $$\gamma = \alpha - \beta \quad (4)$$

The value of L can therefore be computed using following equation (5):

$$\sin \alpha - \sin \beta = (y2-y1)/L - (y4-y3)/L = \alpha - \beta = \gamma \quad (5)$$

$$\gamma = ((y2-y1)-(y4-y3))/L$$

$$L = ((y2-y1)-(y4-y3))/\gamma$$

(the unit of γ is radian)

(8) Arithmetic-logic unit 12 computes distance L on the basis of above described formula (5) and stores it. As was described above, by automatically determining distance L between workpiece alignment marks WAM1 and WAM2 of respective workpiece W and by a comparison of the value of this distance L with the upper and lower boundary values established beforehand, it can be checked whether the distance between the workpiece alignment marks has changed to a great degree or not. If major changes occur with respect to the distance between the above described workpiece alignment marks, error messages can be produced and this reported to the operator or further steps halted and the occurrence of problems prevented.

Furthermore, because distance L between the workpiece alignment marks can be measured and stored each time, it can be immediately checked whether, as a result of changes of the exposure accuracy for the arrangement of workpiece alignment marks in the prior process, major changes of the distance between the workpiece alignment marks have occurred or not. This happens when problems occur with which positioning of the mask to the workpiece cannot be performed.

In addition, by storing distance L between the workpiece alignment marks of the respective workpiece W, data on the distance between the workpiece alignment marks can be collected. This makes it possible to determine changes of the exposure accuracy in the arrangement of the workpiece alignment marks in the process before positioning, and changes such as deterioration of the efficiency of the exposure device which fixes the workpiece alignment marks on workpiece W, and the like. Therefore, a time scale for adjusting the exposure device and the like can be obtained before problems occur in products.

(9) On the basis of the value of above described distance L arithmetic-logic unit 12 computes the deviations of workpiece alignment marks WAM1, WAM2 in the Θ direction with reference to mask alignment marks MAM1, MAM2, i.e., angle ΔΘ.

ΔΘ is determined by the above described and the following formula (1) because the value of L was determined by above described formula (7):

$$\Delta\Theta = \sin^{-1}((y2-y1)/L) \quad (1)$$

After angular offset ΔΘ was determined, as was described above, carrier control element 13 rotates workpiece carrier 4 (or mask carrier 2) by the drive of the Θ-carrier of the workpiece carrier 4 through the angular offset ΔΘ, as in the above described conventional example. After rotation, again mask alignment marks MAM1, MAM2 and workpiece alignment marks WAM1, WAM2 are determined by means of alignment units 5. The X-axis carrier and Y-axis carrier of workpiece carrier 4 are driven by carrier control element 13, and workpiece carrier 4 is moved such that two alignment marks MAM1, WAM1 and MAM2, WAM2 come to rest on top of one another.

In the following, it is described how the value of L can be computed according to above described equation (4) even in the case in which the center of rotation of workpiece W is outside of workpiece alignment marks WAM1, WAM2, as is shown in FIG. 3(b).

Figure 5A:
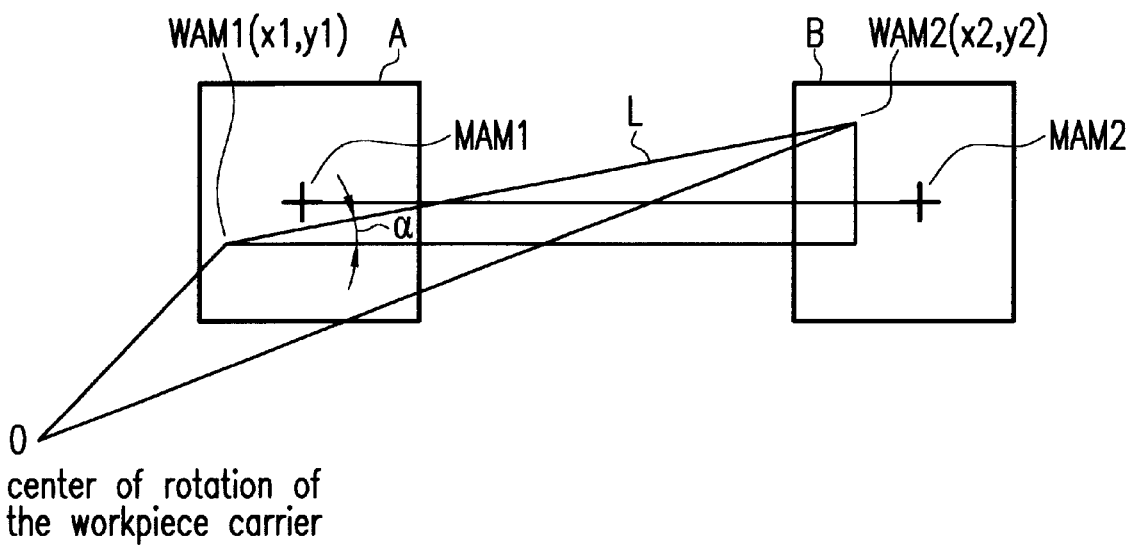
FIGS. 5($a$) and 5($b$) each show a schematic of computation of the amount of position deviation in the case of FIG. 3($b$)
Figure 5B:
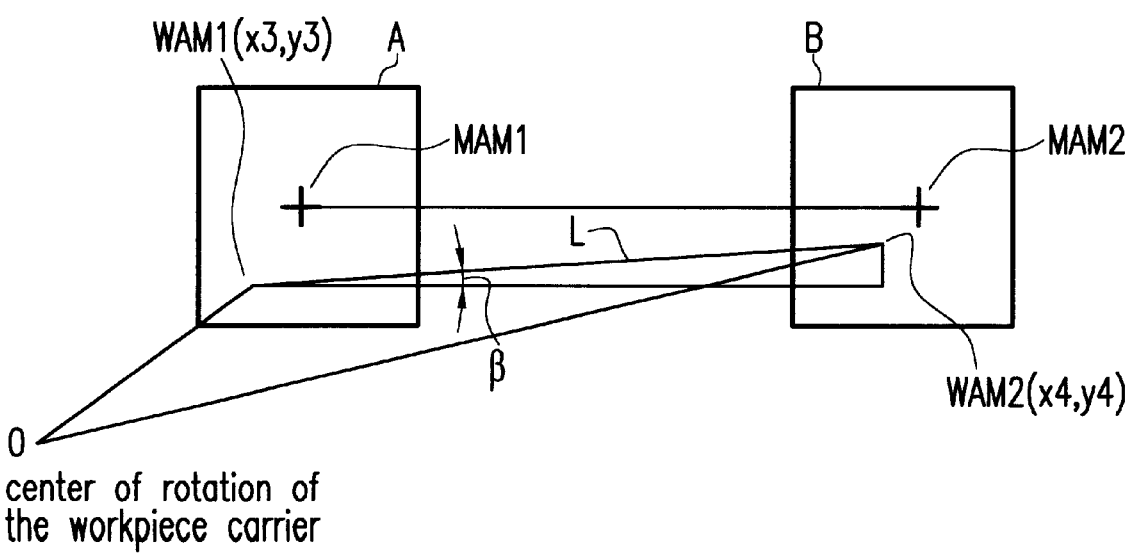

FIGS. 5(a) & (b), 6(a) & (b) and 7 are schematics of computations of the amount of position deviations in the case in which the center of rotation of workpiece W is outside of workpiece alignment marks WAM1, WAM2. FIG. 5(a) corresponds to the above described FIG. 4(a) and FIG. 5(b) corresponds to FIG. 4(b).

As FIGS. 5(a) and (b) show, in this case equations (2) and (3) given below and also the approximation of sin α=α and sin β=β also apply:

$$\sin \alpha = (y2-y1)/L \quad (2)$$

$$\sin \beta = (y4-y3)/L \quad (3)$$

Figure 6A:
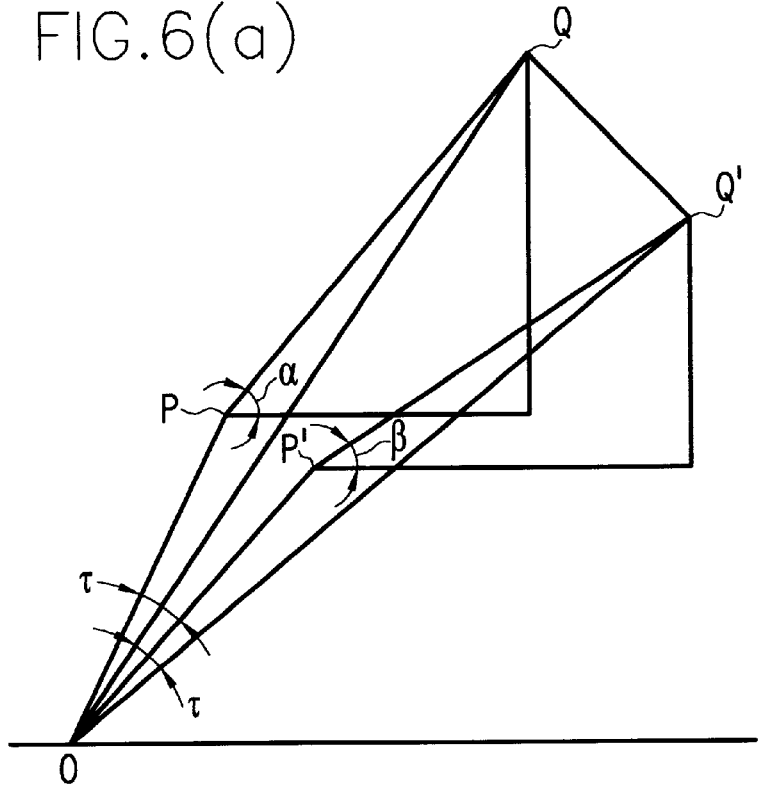
FIGS. 6($a$) and 6($b$) each show a schematic of computation of the amount of position deviation in the case of FIG. 3($b$)

Here, it is assumed that, for rotary motion with angle γ around center of rotation O, the workpiece alignment mark WAM1 is moved from P to P' and workpiece alignment mark WAM2 is moved from Q to Q', as is illustrated in FIG. 6(a). As becomes apparent from FIG. 6 (a), angle P'Q'O and angle PQO are the same.

Figure 6B:
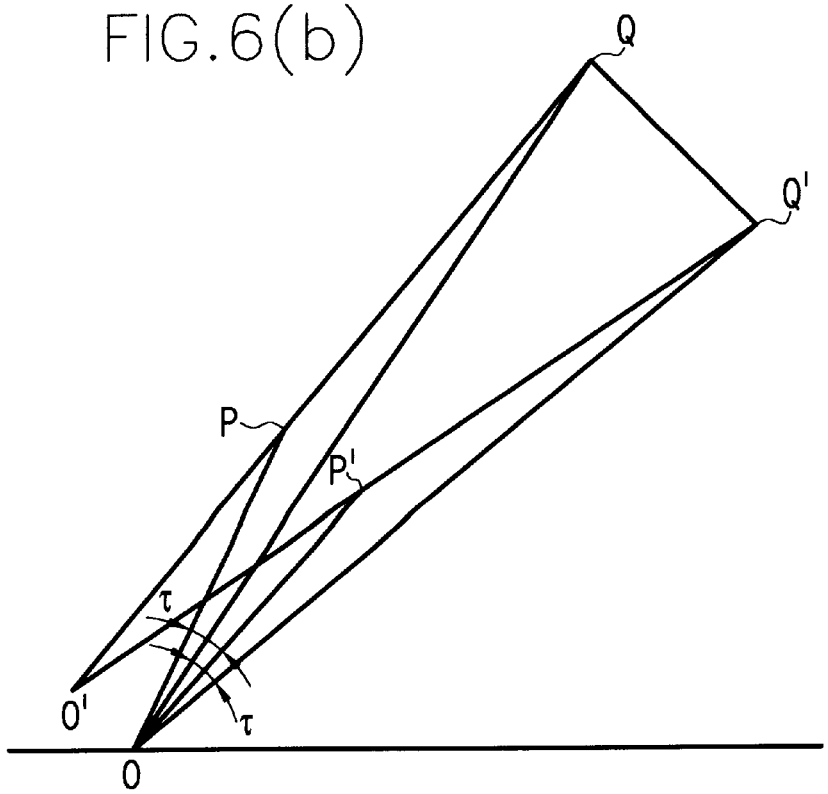
Figure 7:
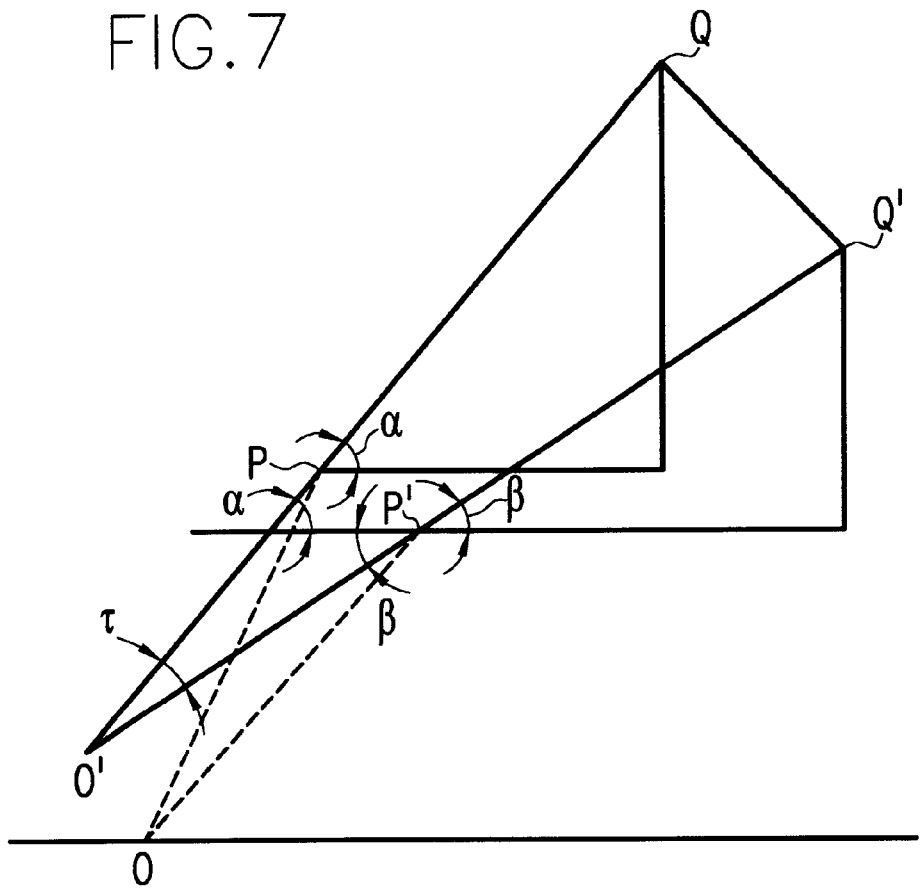
FIG. 7 shows a schematic of computation of the amount of position deviation in the case of FIG. 3($b$)
Figure 8:
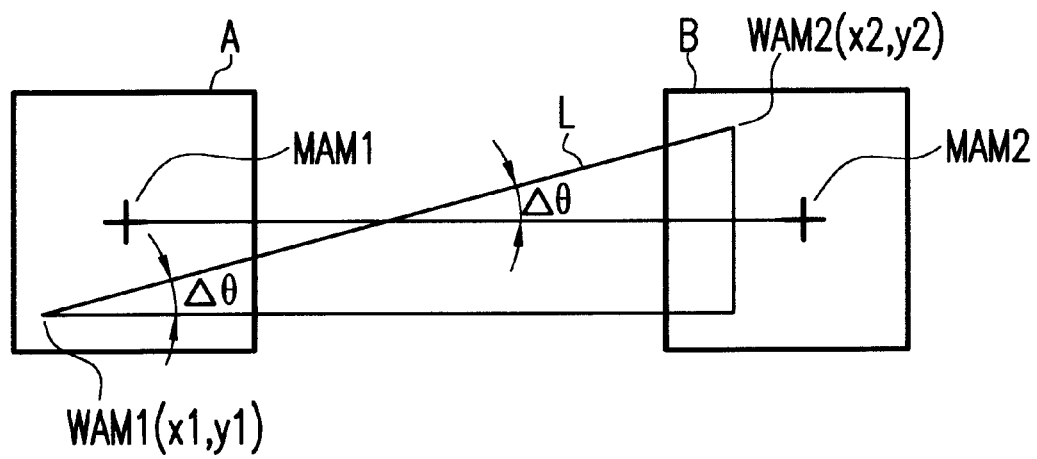
FIG. 8 shows a schematic of conventional computation of the amount of position deviation.

Therefore, if segment QP and segment Q'P' are lengthened, and if the intersection thereof is labelled O', the angle between segment QO' and segment Q'O' and angle γ are the same, as is illustrated in FIG. 6(b). Therefore, the following applies:

$$\gamma = \alpha - \beta$$

Here, above described equation (4) applies, and distance L can be determined by above described equation (5).

A case of positioning of mask M relative to workpiece W by the drive of workpiece carrier 4 was described above. However, mask carrier 2 or workpiece carrier 4 and mask carrier 2 can be driven and positioning of mask M to workpiece W can be performed.

In the above described embodiment, when mask alignment marks MAM1, MAM2 are projected onto workpiece W from exposure light irradiation device (or nonexposure light irradiation device) 1, nonexposure light is emitted. But, mask alignment mark partial illumination systems can be placed in addition; they partially illuminate the peripheral areas of mask alignment marks MAM1, MAM2, and mask alignment marks MAM1, MAM2 can be projected onto workpiece W by these partial illumination systems. Different modifications can be effected as means for determining mask alignment marks MAM1, MAM2 and workpiece alignment marks WAM1, WAM2.

Action of the Invention

As was described above, the following effects can be obtained according to the invention:

(1) By automatically determining the distance between the workpiece alignment marks and by positioning the mask relative to the workpiece, in spite of the different distances between the workpiece alignment marks, the mask can be positioned relative to the workpiece without input of the distance between the workpiece alignment marks beforehand, if the two workpiece alignment marks are located within the visual fields of the alignment units. In this way, operating errors, such as misadjustment of the value of distance L and the like, can be prevented. Furthermore, with respect to workpieces with different distances between the workpiece alignment marks, only by adjusting the positions of the alignment units such that the workpiece alignment marks extend into the visual fields of the alignment units can flexible measures be taken.

(2) Because distance L between the workpiece alignment marks can be measured and stored each time, it can be immediately checked whether major changes of the distance between the workpiece alignment marks have occurred or not as a result of changes of exposure accuracy in the arrangement of the workpiece alignment marks in the previous process. This occurs when problems arise with which positioning of the mask to the workpiece cannot be performed.

(3) By storing distance L between the workpiece alignment marks of the respective workpiece W, data on the distance between the workpiece alignment marks can be collected. This makes it possible to determine changes of the exposure accuracy in the arrangement of the workpiece alignment marks in the process before positioning, and changes such as deterioration of the efficiency of the exposure device which places the workpiece alignment marks on workpiece W, and the like. Therefore, a time scale for adjusting the exposure device and the like can be obtained before problems occur in products.

(4) By a comparison of the value of this distance L with the upper and lower boundary values established beforehand and by stopping further processes and by sending error messages when the distance between the workpiece alignment marks is outside the stipulated range, the occurrence of problems in products can be prevented. It is to be understood that although preferred embodiments of the invention have been described, various other embodiments and variations may occur to those skilled in the art. Any such other embodiments and variations which fall within the scope and spirit of the present invention are intended to be covered by the following claims.

What we claim is:

1. Process for positioning a mask relative to a workpiece comprising the steps of:

irradiating two mask alignment marks of the mask with light from a light irradiation part so as to produce images thereof on a surface of the workpiece;

determining locations of the images of the mask alignment marks which are imaged on the workpiece, and storing positions thereof;

determining locations of two workpiece alignment marks of the workpiece and storing positions thereof as first positions; moving and offsetting at least one of the mask and the workpiece in two orthogonally intersecting directions parallel to the workpiece surface, and producing rotation thereof around an axis of rotation which is perpendicular to a plane which contains the two orthogonally intersecting directions so that the mask alignment marks and the workpiece alignment marks come to rest on top of one another;

wherein said moving and offsetting step comprises the steps of:

rotating the workpiece through a stipulated first angle and then again determining locations the two workpiece alignment marks and storing positions thereof as second positions;

based on the data of the above described first and second positions and of the first angle, determining a distance between the workpiece alignment marks located on the workpiece at two locations, then, based on data of the distance determined between the workpiece alignment marks, determining a second angle which is formed by a line which passes through the two workpiece alignment marks and by a line which passes through the images of the two mask alignment marks;

rotating at least one of the mask and the workpiece around the axis of rotation through an angle corresponding to said second angle, and after this rotation, determining locations of the images of the mask alignment marks imaged on the workpiece and of the workpiece alignment marks and moving at least one of the mask and workpiece to bring the images of the two mask alignment marks into superposed relationship with the workpiece alignment marks.

* * * * *